United States Patent [19]

Nishizawa et al.

[11] Patent Number: 4,952,996
[45] Date of Patent: Aug. 28, 1990

[54] STATIC INDUCTION AND PUNCHING-THROUGH PHOTOSENSITIVE TRANSISTOR DEVICES

[75] Inventors: Jun-Ichi Nishizawa; Takashige Tamamushi, both of Sendai; Hideo Maeda, Tokyo, all of Japan

[73] Assignees: Zaidan Hojin Handotai Kenkyu Shinkokai, Miyagi; Nikon Corporation, Tokyo, both of Japan

[21] Appl. No.: 301,348

[22] Filed: Jan. 25, 1989

[30] Foreign Application Priority Data

Jan. 29, 1988 [JP] Japan .................. 63-17294

[51] Int. Cl.$^5$ .................. H01L 27/14; H01L 31/00
[52] U.S. Cl. .................. 357/30; 357/22; 357/23.4; 357/25.29; 357/32
[58] Field of Search .................. 357/23.4, 22 E, 22 D, 357/30 D, 30 P, 30.0, 22 B, 35, 29, 30 C, 32

[56] References Cited

U.S. PATENT DOCUMENTS 3,836,993 9/1974 Joshi ................. 357/27
4,504,847 3/1985 Nishizawa ........... 357/22

FOREIGN PATENT DOCUMENTS 0009678 1/1987 Japan ................. 357/22

Primary Examiner—Andrew J. James
Assistant Examiner—D. Monin
Attorney, Agent, or Firm—Shapiro and Shapiro

[57] ABSTRACT

A semiconductor device comprises a semiconductor substrate of a low impurity concentration, a channel region formed on the substrate and having a low impurity concentration, a source region formed on the channel region and having a high impurity concentration of a conductive type opposite to that of the substrate, and a drain region formed on the channel region and having a high impurity concentration of a conductive type opposite to that of the substrate. The source region and the drain region are arranged along a predetermined direction along the substrate. The semiconductor device further includes an accumulating gate region of a conductive type same as that of the substrate, so formed as to surround either one of the source region and drain region, leaving a part of said channel region sandwiched between the source region and the drain region. A current flows from either to the other of the source region and the drain region through the part of the channel region sandwiched between the source region and the region. A charge is accumulated in the accumulating gate region according to the intensity of radiation incident on the device. The potential of the accumulating gate region is variable according to the accumulated charge. The current is variable according to the potential of the accumulating gate region.

7 Claims, 7 Drawing Sheets

STATIC INDUCTION AND PUNCHING-THROUGH PHOTOSENSITIVE TRANSISTOR DEVICES

BACKGROUND OF THE INVENTION

1. Field of the Invention

The present invention relates to a photoelectric converting device consisting of static induction transistors or punching-through bipolar transistors of a novel lateral junction structure. Such photoelectric converting device is particularly adapted for use in a solid-state image sensor.

2. Related Background Art

The photoelectric converting device utilizing static induction transistor (SIT) is already known in a vertical structure and a lateral junction structure.

The SIT of lateral junction structure has the advantages of (1) easier control and less fluctuation of device characteristics (particularly current-voltage characteristics) among different SIT's, and (2) possibility of size reduction, because of the smaller diffusion depth of the accumulating gate, in comparison with the vertical structure.

A conventional lateral-junction SIT is shown in FIGS.2A and 2B, which are respectively a schematic plan view and a schematic perspective view.

On an n-substrate 21 there is formed a $p^+$-embedded gate region 25, on which formed is an $n^-$-channel region 22. In the surface layer of said, region 22 there are formed an $n^+$-source region 23, an $n^+$-drain region 24 and a $p^+$-surface gate region 26 positioned therebetween. The gate regions 25, 26 are bonded by plural grating gate regions 27.

A drain current flows in $n^-$-channel regions 22 of widths w, said w being the distance of the grating gate regions 27, and is controlled by a gate potential varying according to the amount of photocharge accumulated in the gate, regions 25, 26, 27.

A separating region 28 separates the pixels, each composed of a photoelectric converting device.

On the $p^+$-surface gate, region 26, there is formed a gate electrode 30 across an oxide film 29, thus constituting a MOS capacitor $C_G$ 31. This is required for resetting and other purposes, but may be dispensed with in case of a single pixel. The same applies to the separating region.

The conventional lateral-junction SIT has been subjected to following drawbacks:

(1) A complex manufacturing process is required for the formation of the $p^+$-embedded gate region 25 and the grating gate, regions 27;

(2) The characteristics of the SIT are adversely influenced by the presence of fluctuations in the gap w of the grating gate regions 27. Since the grating gate regions 27 have to be diffused deep until the embedded gate region 25, the diffusion is difficult to control and the gap w of gratings inevitably shows fluctuation. Consequently, the characteristics (particularly current-voltage characteristics) of the photoelectric converting devices often fluctuate and are unstable;

(3) Making the photoelectric converting device compact is difficult, due to the necessity of the deep embedded gate region 25 and the deep diffused grating gate regions 27.

SUMMARY OF THE INVENTION

In consideration of the foregoing, the object of the present invention is to provide a photoelectric converting device, consisting of lateral-junction SIT or punching-through bipolar transistors which does not require a complex manufacturing process, does not require a deep diffusion, thus avoiding fluctuation in the operating characteristics, and enables easy manufacture in a compact size.

The above-mentioned object can be achieved, according to the present invention, by a semiconductor device comprising:

a semiconductor substrate of a low impurity concentration;

a channel region formed on said substrate and having a low impurity concentration;

a source region formed on said channel region and having a high impurity concentration of a conductive type opposite to that of said substrate;

a drain region formed on said channel region and having a high impurity concentration of a conductive type opposite to that of said substrate; wherein said source region and said drain region are arranged along a predetermined direction along said substrate; and an accumulating gate region of a conductive type same as that of said substrate, so formed as to surround either one of said source region and drain region leaving a part of said channel region sandwiched between said source region and said drain region;

wherein a current flows from one to the other of said source region and said drain region through said part of the channel region sandwiched between said source region and said drain region; a charge is accumulated in said accumulating gate region according to the intensity of radiation incident to said device; the potential of said accumulating gate region is variable according to said accumulated charge; and said current is variable according to the potential of said accumulating gate region.

DESCRIPTION OF THE PREFERRED EMBODIMENTS

In the following there will be explained the structure and function of the photoelectric converting device (SIT or punching-through bipolar transistor) of the present invention employing, by way of example, a p-substrate.

Embodiment 1

Figure 1A:
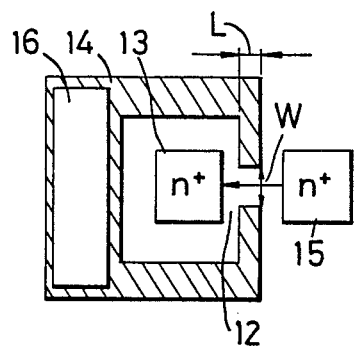
FIG.1A is a schematic plan view of a photoelectric converting device according to a first embodiment of the present invention.
Figure 1B:
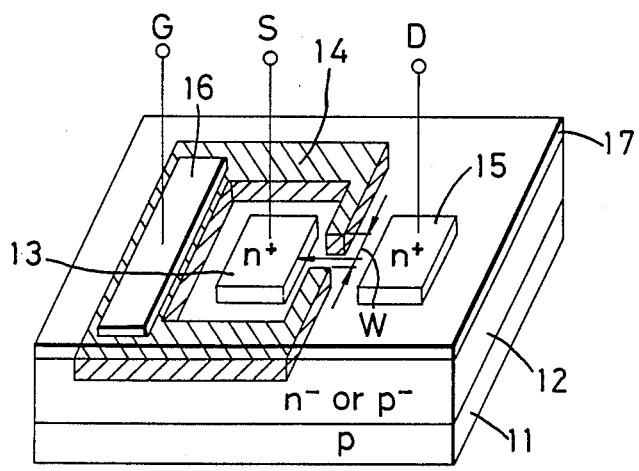
FIG.1B is a schematic perspective view thereof.
Figure 2A:
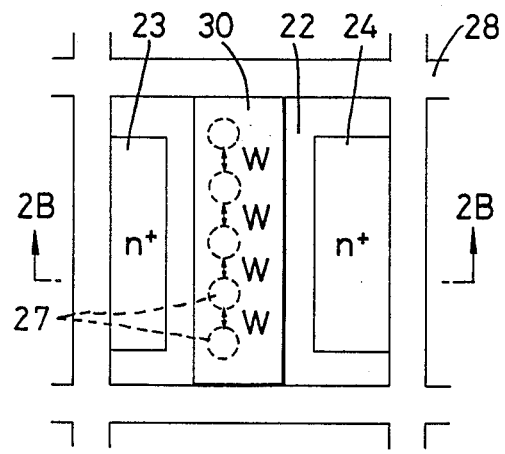
FIG.2A is a schematic plan view of a photoelectric converting device employed in a conventional solid-state image sensor.
Figure 2B:
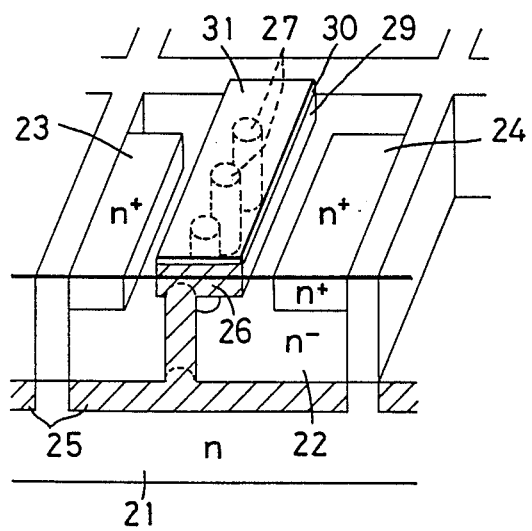
FIG.2B is a schematic perspective view of said device, cut along a line 2B-2B shown in FIG.2A.

FIGS. 1A and 1B which are respectively a schematic plan view and a schematic perspective view of a first embodiment of the invention.

On a p-substrate 11 there is formed an $n^-$- or $p^-$-channel region 12. In a part of the surface layer of said region 12 there are formed an $n^+$-source region 13, and a $p^+$-accumulating gate region 14 so formed as to substantially surround said source region 13. In a part of the accumulating gate region 14 there is formed a break defining a gap w, and an $n^+$-drain region 15 is provided to the outside of said break.

A gate capacitor $C_G$ 16, required for example for resetting, is formed on a part of the accumulating gate region 14, across an oxide or other insulating film 17.

The radiation entering the channel, region 12 is subjected to photoelectric conversion, and the photocharge resulting therefrom is accumulated in the accumulating gate region 14, thus causing a change in the potential $\Delta V_G = \Delta Q/C$, wherein $\Delta Q$ is the amount of accumulated charge, and C is the capacity of the accumulating gate, region.

In response to said potential change in the accumulating gate, region 14, a drain current $I_{DS}$ is amplified according to the $I_{DS}$-$V_{GS}$ characteristics of SIT and flows in the $n^-$- or $p^-$- channel, region 12 in the gap w of the $p^+$-accumulating gate region 14, as indicated by an arrow in FIG. 1B.

A device structure in which the channel region 12 is of a low impurity concentration of a conductive type opposite to that of the substrate 11 is called a static induction transistor (SIT), and a structure in which the channel area is of a low impurity concentration of a conductive type same as that of the substrate is called a punching-through bipolar transistor.

The punching-through bipolar transistor shows a behavior similar to SIT, as the potential of the channel is controlled by the gate voltage. In the following description, therefore, the SIT and the punching-through bipolar transistor shall be collectively referred to as SIT.

It will be appreciated that the characteristics of the SIT of the present invention are determined by the gap width w of the accumulating gate region 14, gate length L, gate diffusion depth, etc.

In FIG. 1A the accumulating gate region 14 is so formed as to substantially surround the source region 13, but it may also be so formed as to substantially surround the source region area 15.

Figure 3A:
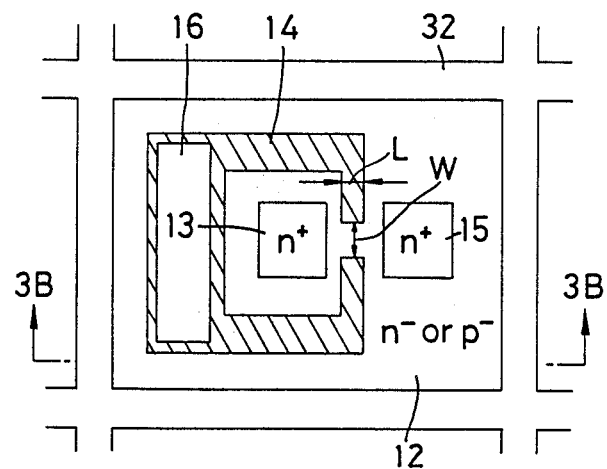
FIG.3A is a schematic plan view of a photoelectric converting device of embodiment 1 of the present invention, employed in a solid-state image sensor.
Figure 3B:
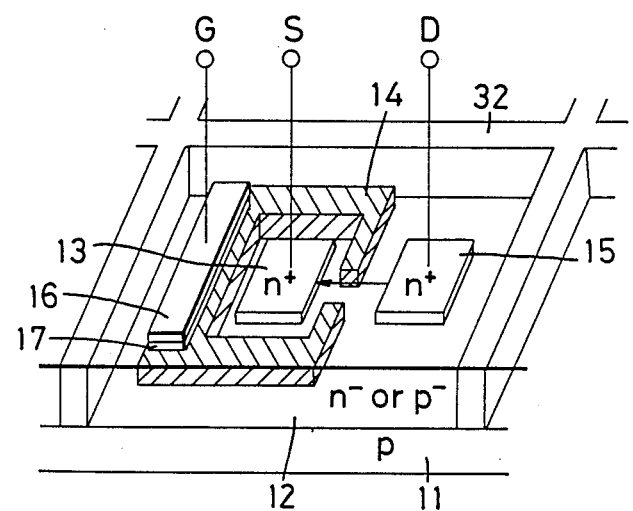
FIG.3B is a schematic perspective view of said device cut along a line 3B-3B shown in FIG.3A.

FIG. 3A is a schematic plan view of a photoelectric converting device of the first embodiment, as applied to a solid-state image sensor, and FIG. 3B is a schematic perspective view thereof.

The photoelectric converting device (SIT) itself will not be explained as it is identical with that shown in FIGS. 1A and 1B.

The SIT is separated as a pixel by a separating area 32, composed of a dielectric material or a pn junction.

Figure 3C:
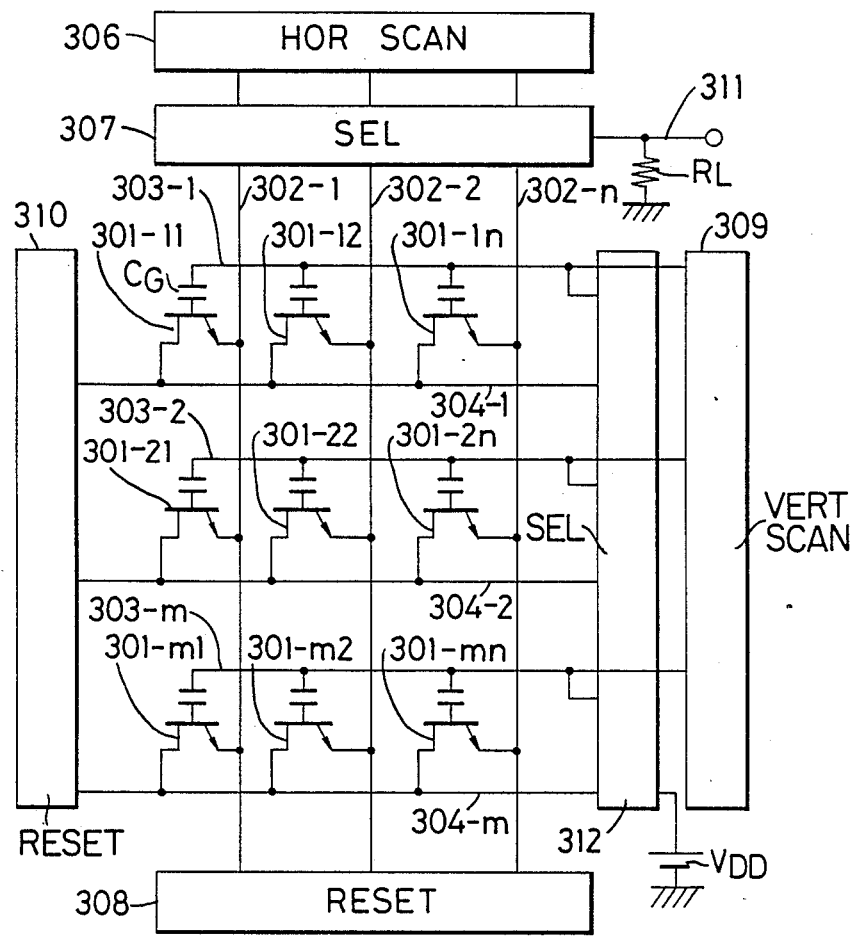
FIG.3C is a circuit diagram of an example of the entire circuit of said solid-state image sensor.

FIG. 3C is a circuit diagram showing an exemplary circuit in which photoelectric converting devices of the present invention are applied to a solid-state image sensor. The circuit for driving the photoelectric converting devices is conventional. The sources of the SIT pixels 301-11 to 301-mn (collectively 301) are connected to column lines 302 1 to 302-n (collectively 302), which are connected to a video line 311 through a readout selecting circuit 307. Said readout selecting circuit 307 is scanned by a horizontal scanning circuit 306. The other ends of the column lines 302 are connected to a column line resetting circuit 308. On the other hand, the drains of the SIT pixels 301 are connected to first row lines 304-1 to 304-m (collectively 304), to which a power supply voltage $V_{DD}$ is applied through a row selecting circuit 312. The other ends of the first row lines 304 are connected to a row line resetting circuit 310.

Second row lines 303-1 to 303-m (collectively 303), connected to the row selecting circuit 312 and the gates of the SIT pixels 301, are scanned by a vertical scanning circuit 309

As noted earlier, FIG. 3C shows only an exemplary circuit. It is also possible to connect the sources (13 in FIG. 3A) of the SIT pixels 301 as drains, and the drains of said pixels as sources. It is furthermore possible to apply the power supply voltage $V_{DD}$ through a load resistor $R_L$ to the video line 311 in FIG. 3C, to ground the first row lines 304 through the row selecting circuit 312, and the column/row resetting circuits 308, 310 as the column/row setting circuits. The present SIT pixel has a high light sensitivity comparable to that of the conventional SIT. FIG. 3C shows only nine SIT pixels, and others are omitted for the purpose of simplicity.

Figure 4A:
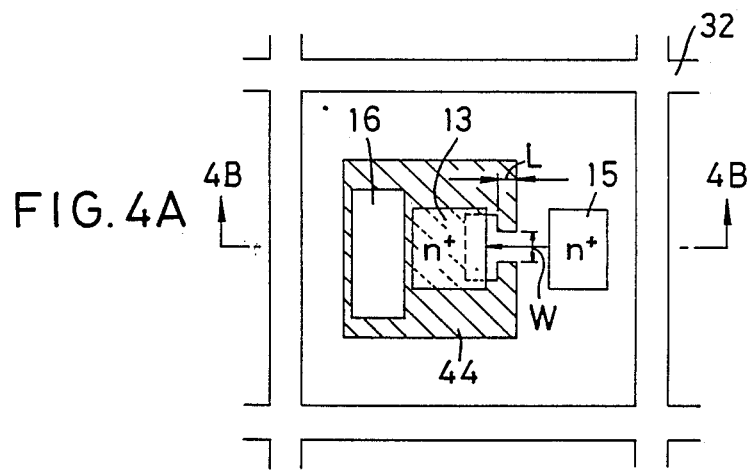
FIG.4A is a schematic plan view of a variation of the embodiment 1.
Figure 4B:
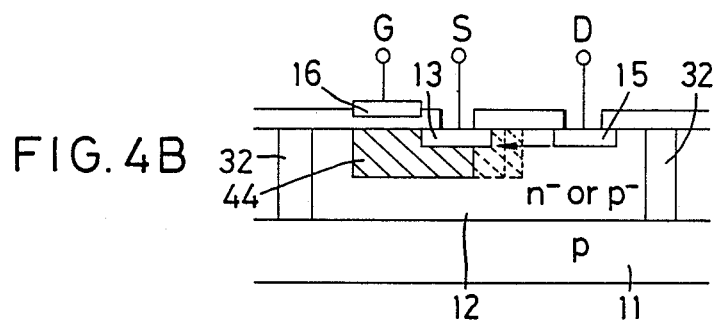
FIG.4B is a schematic cross-sectional view along a line 4B-4B in FIG.4A.

Also in the first embodiment, the structure of SIT size is not limited to that shown in FIGS. 3A and 3B but may be modified as shown in FIGS. 4A and 4B. In FIGS. 4A and 4B, a $p^+$-accumulating gate region 44 is so formed as to surround the $n^+$-source region 13, and, in the direction of distance, the diffusion depth of the accumulating gate region 44 is selected larger than that of the source region 13 (cf. FIG. 4B). In a part of the gate region 44 there is formed a gap of a width w and a length L, and an $n^+$-drain 15 is positioned outside. The drain current of the SIT flows through the portion of the $n^-$- or $p^-$-channel region 12, positioned in the gap w of the accumulating gate region 44, according to the potential the gate region, or the amount of photocharge. Other currents do not flow due to the presence of the accumulating gate region 44.

Consequently the drain current is limited to the channel, region 12 between the source 13 and the drain 14, so that the device is characterized by the reduced leakage current.

Embodiment 2

Figure 5:
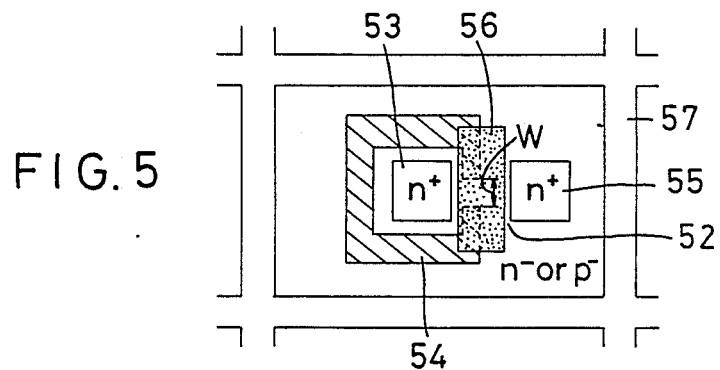
FIG.5 is a schematic plan view of a photoelectric converting device of a second embodiment.

FIG. 5 is a schematic plan view of the photoelectric converting device of a second embodiment.

A gate capacitor $C_G$ 56, constituting a MOS gate, is formed on the channel region 52 positioned between the $n^+$-source region 53 and drain, region 55, and on the gap of a width w of the accumulating gate region 54, by a gate electrode positioned on a gate oxide film. 57 indicates a separating region.

This photoelectric converting device functions in the following manner. An accumulated charge, generated by photoelectric conversion, is distributed in the p+-accumulating gate region 54 and in the channel region 52 positioned below the gate capacitor $C_G$ 56, according to the capacitances thereof.

The change in the gate voltage $V_G$, caused by the amount of photocharge $\Delta Q$ is represented by $\Delta V_G = \Delta Q/C$, wherein C is the total parallel capacitance of the accumulating gate region 54 and the gate capacitor $C_G$ 56.

When a signal readout gate pulse $\phi_G$ is applied to the gate terminal, the gate voltage $V_G$ is changed to $V_G = \Delta V_G + \phi_G$, whereby a drain current $I_{DS}$ is generated according to the $I_{DS} - V_{GS}$ characteristics of the SIT, and the output signal is obtained as the amplification of the photocharge $\Delta Q$.

Also in the embodiment 2, the device can be easily manufactured with reduced fluctuation in the characteristics, and can be easily made compact, as the diffusion, regions 54, 53, 55 can be formed by shallow diffusion from the surface. Also the drain current $I_D$ flows internally of the channel region 52 due to the presence of accumulated charge on the surface. Consequently the 1/f noise resulting from the surface trapping can be reduced, and the dark current can therefore be suppressed. The dark current is also reduced because the accumulating gate region 54 and the gate capacitor $C_G$ 56 are not in contact with the separating region 57.

Furthermore the gate capacitor $C_G$ 56, source region 53 and drain region 55 can also be prepared by self-alignment, and the manufacturing process is even more simplified in such case.

The photoelectric converting device of the second embodiment is not limited to the plan structure shown in FIG.5 but may assume a structure similar to that shown in FIG.4A, in which case the gate capacitor $C_G$ 16 would be formed, across a gate oxide film, in an area between the source region 13 and the drain region 15.

Embodiment 3

Figure 6A:
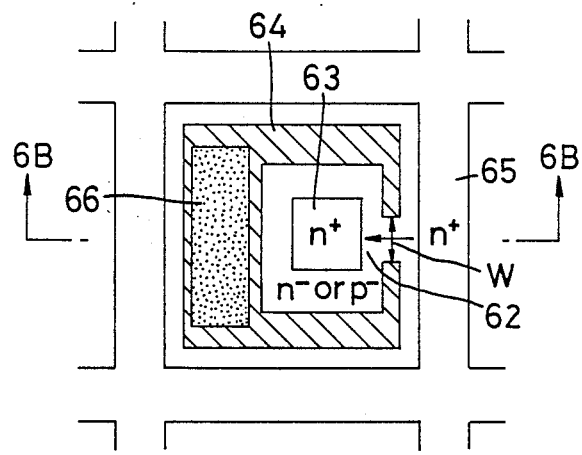
FIG.6A is a schematic plan view of a photoelectric converting device of a third embodiment of the present invention, employed in a solid-state image sensor.
Figure 6B:
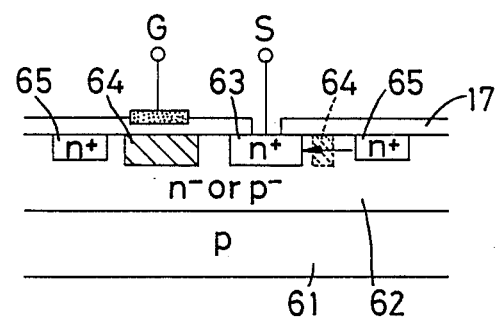
FIG. 6B is a schematic cross-sectional view thereof along a line 6B-6B of FIG. 6A.
Figure 6C:
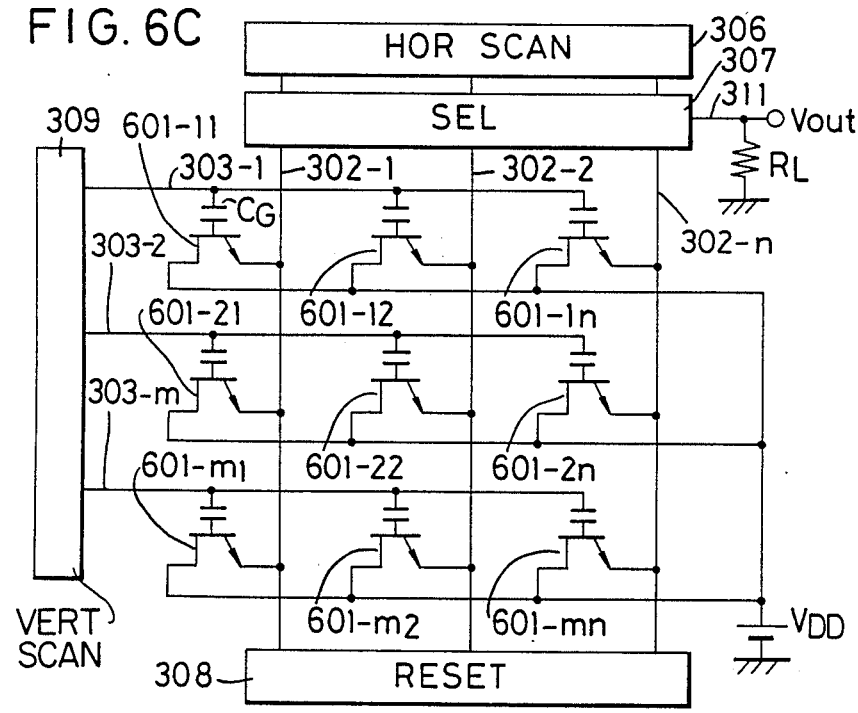
FIG. 6C is a circuit diagram of an example of the entire circuit of said solid-state image sensor.

FIG.6A is a schematic plan view of a photoelectric converting device (SIT) of a third embodiment, applied to a solid-state image sensor, and FIG.6B is a schematic cross-sectional view thereof. FIG.6C is a circuit diagram of an example of the entire circuit of said solid-state image sensor.

In this photoelectric converting device, a p+-accumulating gate region 64 is so formed as to surround an n+-source region 63, and an n+-drain region 65 is provided outside the gap of a width w, commonly for all the pixels (SIT) for serving also as the separating area. There are also shown a p-substrate 61; an n⁻- or p⁻-channel region 62; and a gate capacitor $C_G$ 66.

The SIT of the present embodiment, in which the separating region is used also for the drain region 65, dispenses with complex processes such as deep diffusion or trench formation, thus enabling further size reduction of the SIT pixel.

Also in the present embodiment, the accumulating gate region 64, gate capacitor $C_G$ 66 and source region 63 may be constructed, as in the second embodiment, in such a manner that the gate capacitor $C_G$ 66 is formed, across an oxide film, on the gap of width w of the gate region 64, positioned between the source region 63 and drain region 65.

It is also possible to connect, as shown in FIG.6C, the n+-source terminals (source region 63 in FIGS.6A and 6B) of the SIT pixels 601 as the n+-drain terminals, and the common n+-drain terminals (drain regions 64 shown in FIGS.6A and 6B) as the source terminals common to all the pixels. It is to be noted that FIG.6C shows only a part of the total number of SIT pixels for the purpose of simplicity, as in FIG.3C.

Also the SIT's of the present embodiment may be arranged one-dimensionally for use as a line sensor.

Embodiment 4

Figure 7:
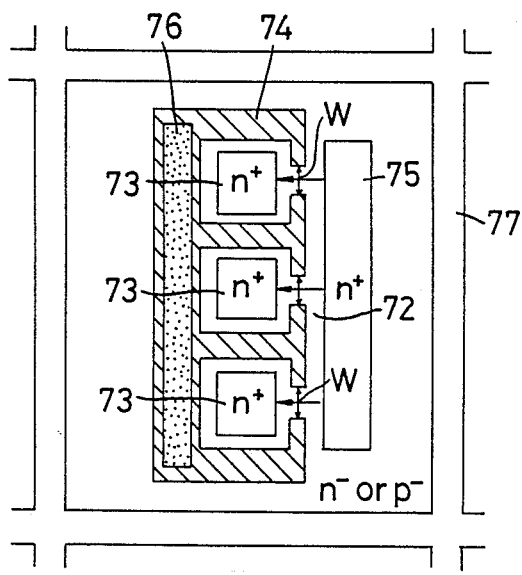
FIG. 7 is a schematic plan view of a photoelectric converting device of a fourth embodiment.

FIG.7 is a schematic plan view of a photoelectric converting device (SIT) of a fourth embodiment, applied to a solid-state image sensor.

In this device there are provided plural (three) n+-source regions 73, and a p+-accumulating gate region 74 is so formed as to respectively substantially surround said source regions. On the other hand an oblong n+-drain region 75 is provided opposite to said plural source regions 73, and in parts of the gate, region 74 sandwiched between source regions 73 and the drain region 75, there are formed (three) gaps of a width w each. There are also shown an n⁻- or p⁻-channel region 72; a gate capacitor $C_G$ 76; and a separating region 77.

The gate capacitor $C_G$ 76 may be positioned on a part of the gate region 74 as shown in FIG.7, or on the channel region 72, on the gap of width w of the accumulating gate, region 74 positioned between the source region 73 and drain region 75.

Also the accumulating gate region 74 may be diffused deeper than the source 73 so as to surround said source, as in the embodiment shown in FIG. 4A.

In FIG.7, the plural source regions 73 may be respectively provided with terminals to constitute a multi-source SIT pixel. On the other hand, it is also possible to enlarge the length of the source region by employing only one source region 73 or inter-connecting the plural source regions 73 in a pixel, thereby obtaining a high source or drain output current.

The separating region 77 may be separated from the drain region 75 as shown in FIG.7, or may be united with the drain region 75, as in the embodiment shown in FIG.6A.

The present invention is not limited to the foregoing embodiments, but is subject to various modifications. For example, the gate MOS structure constituting the gate capacitor $C_G$ may be replaced by a MIS structure. Also the separating area need not necessarily reach the substrate, as it is still capable of suppressing the cross-talk to a certain extent.

The SIT pixel, which is rectangular in the foregoing embodiments, may assume other forms, such as a polygonal form or a circular form.

The p+-accumulating gate region, which is assumed to have a high p+impurity concentration, may also assume a low p⁻ impurity concentration or a medium p impurity concentration. Also it need not be uniform in impurity concentration, but it may include an area of different concentration.

In the foregoing embodiments there has been employed an n-SIT for the convenience of description, but a p-SIT may naturally be adopted.

The SIT of the present invention may be employed not only singly but in plural units to form a photoelectric converting device, a line sensor, a solid-state image sensor or the like. In such case the photoelectrically converted charge is accumulated in the accumulating gate region of the SIT pixel, and a reading pulse is applied through the gate capacitor $C_G$ to obtain an output signal. It is also possible to dispense with the gate capacitor $C_G$ and to obtain the DC drain current with the accumulating gate region in the floating state, or to form an electrode in the accumulating gate region and to apply a gate bias voltage thereto through a resistor thereby obtaining an amplified drain current proportional to the photocharge. Any of the foregoing embodiments may be employed as the SIT pixel. In case the SIT of the structure shown in FIG.3A, 4A, 5 or 7 is employed in a photoelectric converting device composed of a SIT, the separating region and the gate capacitor $C_G$ may be dispensed with.

In the present invention, the p-substrate constitutes a back gate. It is therefore possible to activate a PNP parasite transistor ($p^+$-accumulating gate region - $n^-$ or $p^-$-channel - p-substrate) as an overflow drain for saturating illumination, according to the method of potential application to said p-substrate.

The manufacturing process of the SIT of the present invention is similar to the MOS process used in the peripheral scanning circuits and in the readout selecting circuits, so that the process can be used in common.

The photoelectric converting device of the embodiment 1 or 2 has a particularly high light sensitivity, and can receive or detect very weak light. In the structure of the embodiment, the gate capacitor $C_G$ 56, source area 53 and drain area 55 can be prepared by self-alignment, and the process can be simplified even more in such case.

The structure of the third embodiment can further simplify the process and can achieve an especially compact pixel, as the drain region 65 is also used as the separating region.

The structure of the fourth embodiment can utilize the source terminals for various purposes because of the multisource structure, or can obtain a large source or drain current by an elongated source length, obtained by a multi-channel structure with the united source terminals.

What is claimed is:

1. A semiconductor device comprising:
   (a) a semiconductor substrate of a low impurity concentration;
   (b) a channel region formed on said substrate and having a low impurity concentration;
   (c) a source region formed in said channel region and having a high impurity concentration of a conductive type opposite to that of said substrate;
   (d) a drain region formed in said channel region in alignment with said source region along a line substantially parallel to said substrate and having a high impurity concentration of a conductive type opposite to that of said substrate; and
   (e) an accumulating gate region of the same conductive type as said substrate, said accumulating gate region substantially surrounding one of said source region and said drain region in planes substantially parallel to said substrate and having a predetermined gap leaving a part of said channel region sandwiched between said source region and said drain region, said accumulating gate region also having a portion disposed beneath said one of said source region and said drain region and sandwiched between said one region and said channel region;
   wherein a current flows from one to the other of said source region and said drain region through said part of said channel region, said accumulating gate region is adapted to accumulate a charge corresponding to an intensity of radiation incident on said device, the potential of said accumulating gate region is variable according to the amount of said accumulated charge and said current is variable according to the potential of said accumulating gate region.

2. A semiconductor device according to claim 1, wherein said accumulating gate region is connected to the underside of said substantially surrounded one of said source region and said drain region.

3. A semiconductor device comprising:
   (a) a semiconductor substrate of a low impurity concentration;
   (b) a channel region formed on said substrate and having a low impurity concentration;
   (c) a source region formed in said channel region and having a high impurity concentration of a conductive type opposite to that of said substrate;
   (d) a drain region formed in said channel region and having a high impurity concentration of a conductive type opposite to that of said substrate;
   (e) an accumulating gate region of the same conductive type as said substrate, said accumulating gate region substantially surrounding one of said source region and said drain region in planes substantially parallel to said substrate and having a predetermined gap leaving a part of said channel region sandwiched between said source region and said drain region;
   (f) an insulating layer laminated on said accumulating gate region and said part of said channel region; and
   (g) an electrode member formed on said insulating layer above said part of said channel region and a part of said accumulating gate region;
   wherein a current flows from one to the other of said source region and said drain region through said part of said channel region, said accumulating gate region and said part of said channel region are adapted to accumulate a charge corresponding to an intensity of radiation incident on said device and said current is variable according to said accumulated charge and a voltage applied to said electrode member.

4. A semiconductor device comprising:
   (a) a semiconductor substrate of a low impurity concentration;
   (b) a channel region formed on said substrate and having a low impurity concentration;
   (c) a first high concentration region having a high impurity concentration of a conductive type opposite to that of said substrate;
   (d) a second high concentration region having a high impurity concentration of a conductive type opposite to that of said substrate;
   (e) an accumulating gate region of the same conductive type as said substrate and formed in said channel region, said accumulating gate region substantially surrounding said first high concentration region in planes substantially parallel to said substrate and being surrounded by said second high concentration region in planes substantially parallel to said substrate, said accumulating gate region further having a predetermined gap leaving a part of said channel region sandwiched between said first high concentration region and said second high concentration region; and wherein a current flows from one to the other of said first and said second high concentration regions through said part of said channel region, said accumulating gate region is adapted to accumulate a charge corresponding to an intensity of radiation incident on said device and said current is variable according to said accumulated charge.

5. A semiconductor device comprising:
(a) a semiconductor substrate of a low impurity concentration;
(b) a channel region formed on said substrate and having a low impurity concentration;
(c) source region means formed in said channel region and having a high impurity concentration of a conductive type opposite to that of said substrate;
(d) drain region means formed in said channel region and having a high impurity concentration of a conductive type opposite to that of said substrate;
(e) one of said source region means and said drain region means comprising a plurality of separate regions formed at spaced locations in said channel region; and
(f) an accumulating gate region of the same conducive type as said substrate and formed in said channel region, said accumulating gate region substantially surrounding each of said plurality of regions in planes substantially parallel to said substrate and having a corresponding plurality of predetermined gaps each leaving a part of said channel region sandwiched between a respective one of said plurality of regions and the other of said source region means and said drain region means;

wherein a current flows from one to the other of said source region means and said drain region means through the sandwiched parts of said channel region, said accumulating gate region is adapted to accumulate a charge corresponding to an intensity of radiation incident on said device, the potential of said accumulating gate region is variable according to the amount of said accumulated charge, and said current is variable according to the potential of said accumulating gate region.

6. A semiconductor device according to claim 5, wherein said plurality of regions are spaced along a predetermined direction, and wherein the other of said source region means and said drain region means is constituted by a continuous region elongated in said predetermined direction with portions thereof respectively aligned with said plurality of regions in a direction perpendicular to said predetermined direction.

7. A semiconductor device comprising:
(a) a semiconductor substrate of a low impurity concentration; and
(b) a plurality of pixels formed on said substrate, each pixel including a channel region having a low impurity concentration, a first high concentration region having a high impurity concentration of conductive type opposite to that of said substrate, a second high concentration region having a high impurity concentration of a conductive type opposite to that of said substrate and separating the pixel from each adjacent pixel, and an accumulating gate region of the same conductive type as said substrate and formed in said channel region, said accumulating gate region substantially surrounding said first high concentration region in planes substantially parallel to said substrate and being surrounded by said second high concentration region in planes substantially parallel to said substrate, said accumulating gate region further having a predetermined gap leaving a part of said channel region sandwiched between said first high concentration region and said second high concentration region;

wherein a current flows in each pixel from one to the other of said first and said second high concentration regions through said part of said channel region, said accumulating gate region is adapted to accumulate a charge corresponding to an intensity of radiation incident on said device and said current is variable according to said accumulated charge.

* * * * *